United States Patent [19]

Tachibana et al.

[11] 4,416,215
[45] Nov. 22, 1983

[54] APPARATUS FOR FABRICATING GRAVURE PRINTING CYLINDERS WITH SYNTHETIC RESIN SURFACE

[75] Inventors: Eiichi Tachibana, Funabashi; Shinichi Hikosaka, Musashino, both of Japan

[73] Assignee: Dai Nippon Insatsu Kabushiki Kaisha, Japan

[21] Appl. No.: 371,996

[22] Filed: Apr. 26, 1982

Related U.S. Application Data

[62] Division of Ser. No. 170,156, Jul. 18, 1980, Pat. No. 4,339,472.

[30] Foreign Application Priority Data

Jul. 27, 1979 [JP] Japan ............................... 54-95734

[51] Int. Cl.³ .......................... B05C 3/18; B05C 11/02
[52] U.S. Cl. .................................... 118/642; 118/409; 118/413; 118/414
[58] Field of Search ............... 118/409, 413, 414, 680, 118/682, 642

[56] References Cited
U.S. PATENT DOCUMENTS 3,767,457  10/1973  Hubbard, Jr. et al. ......... 427/54.1 X
3,900,595   8/1975  Giori ................................. 427/55

FOREIGN PATENT DOCUMENTS 54-8001   1/1979  Japan .
54-22208  2/1979  Japan .
1544748   4/1979  United Kingdom .

Primary Examiner—Evan K. Lawrence
Attorney, Agent, or Firm—Parkhurst & Oliff

[57] ABSTRACT

A method and an apparatus for fabricating gravure printing cylinders of synthetic resin in which a photo-setting polyamide resin used as a solution of a coating resin is applied over the surface of a cylindrical base spirally as successively overlaid layers and thereafter the applied resin is subjected to drying by a heater and to photosetting by irradiation with ultraviolet rays, electron rays or the like. The resin layer surface thus obtained is mechanically engraved by an electronic engraver for forming gravure cells. The irradiation of ultraviolet ray, electron ray, or the like may be effected during or after application of the polyamide resin over the cylindrical base. The apparatus comprises a resin solution retainer closely adjacent to the cylindrical base. A substantially vertical lever pivoted for movement toward and away from the base supports the solution retainer. The lever may be moved by an element such as a motor-driven eccentric cam.

8 Claims, 4 Drawing Figures

APPARATUS FOR FABRICATING GRAVURE PRINTING CYLINDERS WITH SYNTHETIC RESIN SURFACE

This is a division of application Ser. No. 170,156 filed July 18, 1980, U.S. Pat. No. 4,339,472.

BACKGROUND OF THE INVENTION

This invention relates to an apparatus for fabricating gravure printing cylinders with a synthetic resin surface, having excellent engraving quality, wear resistance, and solvent resistance.

In recent years, with developments in electronics, automatic and precise etching of gravure cylinders by means of electronic engravers is coming into wide practice.

In addition to the conventional gravure cylinders entirely made of metal, gravure cylinders with a printing surface made of synthetic resin are entering into this field.

Heretofore, for making gravure cylinders, wide use has been made of the so-called "conventional" method, which comprises the steps of plating a copper layer over a cylindrical base, placing an exposed carbon tissue having a latent image over the copper layer, developing the carbon tissue, etching the cylinder through the carbon tissue, thereafter stripping the tissue from the layer, and chromium plating the tissue-stripped cylinder. This method involves pollution problems since it includes chemical treatment processes, such as plating and etching processes, and further, the method necessitates highly skilled art and labor for forming gravure cells as the etching is made by the use of the carbon tissue.

The electronic engraver simplifies the etching process, and the formation of the printing surface with resin eliminates the plating processes. On these points, the method of fabricating gravure cylinders in which the resin coated over the printing surface is engraved by an electronic engraver is being developed as an excellent method for making gravure printing plates.

However, such resin-coated gravure printing cylinders are inferior in productivity and have not yet satisfied the requirements for the gravure printing, such as engraving quality, wear resistance, and solvent resistance.

Conventionally, vinylchloride resins, ABS resins, aliphatic polyamide resins, and the like are used for the gravure cylinder coating. With respect to polyamide resins, an alcohol-soluble polyamide such as copolymer nylon, and modified nylon can be dissolved in a solvent and caused to adhere to a cylindrical base by a method called the blade coater method but has very low solvent resistance against the gravure ink. On the other hand, nylon 6, 66, 610, 11, 12 and the like have solvent resistance, but it is difficult for these resins to be dissolved in a solvent to be coated over the gravure cylinder. Under the existing circumstances, with respect to the polyamide resin, the use of the plastic molding method utilizing its thermoplasticity and powder coating method is being tried. These methods, however, necessitate rather large apparatus and have further disadvantages in the production of the gravure cylinder such as the necessity of surface smoothing by means of a super-precision lathe after adhesion of the resin.

Vinylchloride resin can be also caused to adhere to the cylindrical base by the above mentioned blade coater method but requires degassing and surface smoothing processes. Further, the finished coating has low solvent resistance and accordingly is greatly restricted in the printing conditions such as the use of water-base gravure ink.

In addition, all gravure printing cylinders with printing surfaces made of the foregoing resins by the aforementioned methods have relatively low wear resistance. That is, the gravure printing cylinders are easily scratched by impurities in the ink and on the doctor blade, dust and the like, almost all cylinders being damaged during printing of web of less than 10,000 meters long, and it is difficult to apply these cylinders to large lot printing of more than 100,000 meters long. In the attempt to improve the wear resistance, the doctor blade is being made of synthetic resin but is inferior in edge accuracy, edge machining property, ink scraping property, etc., and lacks utility.

The foregoing synthetic resins also have inferior engraving property. More specifically, the engraving of the pattern of an original by the engraving needle is likely to produce burrs and breaks around the cells. Since such burrs can be the cause of scumming, a knife called a burr cutter is provided in the electronic photoengraving machine for scraping away the burrs. However, the operation of the burr cutter can cause the smooth surface of the non-image area to suffer scratches, and thus a burr cutter itself becomes a cause of scumming.

Accordingly, it is desirable that the resin layer has an engraving property which makes a burr cutter unnecessary.

SUMMARY OF THE INVENTION

It is accordingly an object of the invention to provide a novel apparatus for fabricating gravure cylinders which have excellent wear resistance and solvent resistance and are capable of large-lot printing.

It is a further object of the invention to provide a novel apparatus for fabricating gravure cylinders that can be uniformly levelled to prevent undulations, scratches or the like from being produced thereby to simplify or eliminate the subsequent smoothing process and to obtain with high precision the smoothness of the printing surface required for the gravure printing.

It is another object of the invention to provide a novel apparatus for making gravure cylinders that have excellent engraving properties and are almost completely free of burrs, breaks, etc., thereby to afford excellent tone reproduction, and to make unnecessary a burr cutter for the electronic engraver, which means assurance of a higher tone reproductivity because the scratches or abrasions which have been produced by the conventional burr cutter can be avoided.

These and other objects of the invention are achieved by a apparatus for fabricating gravure printing cylinders having a printing surface of synthetic resin, in which a photosetting-polyamide resin solution is applied spirally over the surface of a cylindrical base and subjected to drying by a heater and to photosetting by irradiating thereof with ultraviolet rays, electron rays, or the like, and the set resin layer surface thus obtained is mechanically engraved with an electronic engraver to form gravure cells. This method increases the productivity in the production of the gravure printing cylinder and further provides gravure cylinders of excellent engraving property, and wear and solvent resistances.

While the specification concludes with claims which particularly point out and distinctly define the subject matter which is regarded as the invention, it is believed the invention will be more clearly understood from the following detailed description and the accompanying drawing.

DETAILED DESCRIPTION OF THE INVENTION

Figure 1:
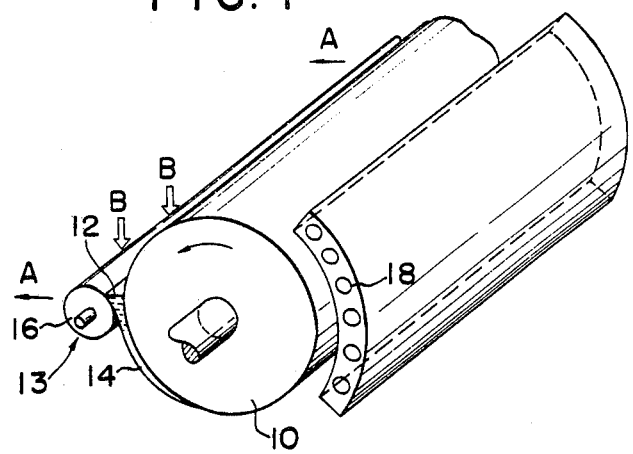
FIG. 1 is a diagrammatic perspective view illustrating the step of applying resin solution.

FIG. 1 illustrates the principle of the fabrication of a gravure cylinder having a synthetic resin printing surface consisting of an endless resin layer according to the present invention.

In the fabrication of the gravure cylinder, a cylindrical base 10 is prepared from a material selected from various materials. The base 10 may be an iron core having its surface provided with a hard layer of copper plating or the like, a core having an elastic layer coated on its surface, or a core made almost entirely of synthetic resin. A photosetting polyamide resin solution 12 is applied as a coating onto this base 10, in which step, the base is heated to about 40° to 50° C. for facilitating adhesion of the resin solution.

The photosetting polyamide resin solution 12 is prepared by dissolving in an alcohol a solid resin component comprising a polyamide to which a photopolymeric monomer, a photopolymerization initiator, and other additives have been added.

Figure 2:
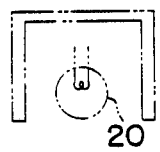
FIG. 2 is a diagrammatic side view showing how the resin solution is applied spirally.
Figure 2:
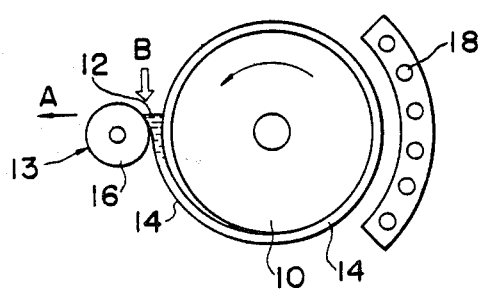

The resin solution 12 is applied by a coating device 13 to form a spiral layer 14 as shown in FIG. 2. The resin solution is used preferably in the state of low viscosity, e.g., 10–400 cps, preferably 40–100 cps at 25° C. This low viscosity is required for applying precisely a thin film by the coating device over the surface of the base 10 thereby avoiding undulations, bubbles, scratches, and other defects.

In the coating device 13 shown, a roller-type resin solution retainer 16, which can be either nonrotatable or reversely rotated relative to the base 10, is used. The solution 12 is supplied between the retainer 16 and the base 10 as indicated by arrow B. An air-currentless heat dryer 18, preferably containing a farinfrared ray generating heater, is used for drying. The dryer 18 has an arcuate shape and is disposed on the side of the base 10 remote from the retainer 16. The base 10 is rotated counterclockwise, and the retainer 16 is gradually moved by suitable means such as that shown in FIG. 4 in the direction of arrow A shown in FIG. 1, to enable the spiral application of the photosetting solution 12 over the surface of the base 10. The solution 12 thus applied is dried quickly by radiant heat from the dryer 18 as the base 10 rotates and substantially fully dried during one turn of the base to form a dried layer of the photosetting polyamide resin. As a result, an endless resin layer 14 with a thickness of about 50 to 500 μ is formed on the base surface.

Figure 3:
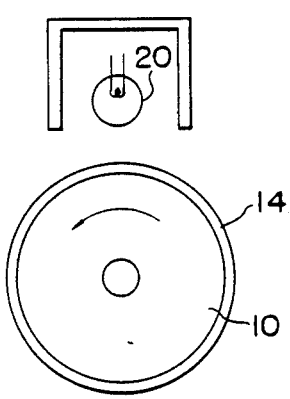
FIG. 3 is a diagrammatic side view showing the step of setting the resin layer.

After the above described applying and drying processes, the base 10 is moved to another place and rapid setting of the resin layer is carried out at shown in FIG. 3 with the use of a setting lamp 20. The setting may be either an ultraviolet photosetting or a radical polymerization setting by electron rays or the like. Ultraviolet rays are projected from, for example, a xenon lamp, mercury-vapor lamp, metallic halide lamp, chemical lamp, carbon arc lamp, or the like. In view of the rapidly of the resin layer setting, a high-pressure mercury-vapor lamp, chemical lamp, or the like having a peak at 365 mμ wave length is preferably used as the light source 20.

As electron rays, those of electrocure (scanning) type or electrocurtain type may be used.

With the aim of speeding up the forming of the layer, the foregoing setting process may be carried out during the application of the resin solution 12. As indicated by chain line in FIG. 2, an ultraviolet ray source, an electron ray irradiating device, or the like may be provided as shown at 20 immediately adjacent to the dryer 18 thereby performing drying and setting for each rotation of the base. In this case, however, surface smoothing such as polishing and grinding may be required later in some instances because the setting is accomplished before slight undulations, which have been caused by the scraping of the blade or roller 16 during the resin application, are sufficiently levelled.

The resin layer thus set is thereafter subjected to surface smoothing. The gravure printing belongs to so-called intaglio printing in which the ink on non-image parts is scraped off by a doctor blade, and the ink retained in the cells is transferred to paper. For this reason the smoothness of the cylinder surface must be of very high accuracy, of deviations of less than 1μ, preferably less than 0.5μ.

The aforementioned coating according to the present invention provides the smoothness of the resin layer of an accuracy close to or almost the same as that mentioned above. Accordingly, this surface smoothing is carried out with a very simple operation as necessary as, for example, when sufficient levelling is not attained in the coating process.

The surface smoothing is performed by, for example, sandpapering, buffing, cutting tool grinding or the like. In any case, a very small amount of grinding or cutting is needed.

The gravure printing blank obtained in this way is subsequently subjected to the electronic engraving or hand engraving whereby gravure cells with varying size and depth are formed in the set resin layer 14 according to the tone of the original.

The resin layer 14 set by light, electron rays or the like is superior in engraving quality to thermoplastic resin, and almost no burrs and breaks are produced around the cells during engraving thereof. The electronic engraver is provided with a burr-cutting knife called a burr cutter, but there is no need for the operation of this burr cutter for the engraving of the resin layer as set according to the invention. However, the engraving property is further improved by carrying out, after the setting process, a baking step according to necessity in which the resin layer is placed in an atmosphere of about 100° C. to stabilize the hardness thereof.

The cylinder after being engraved is proofed and, if necessary, corrected and is thereafter mounted as a printing cylinder on a rotary press to be used for gravure printing.

Figure 4:
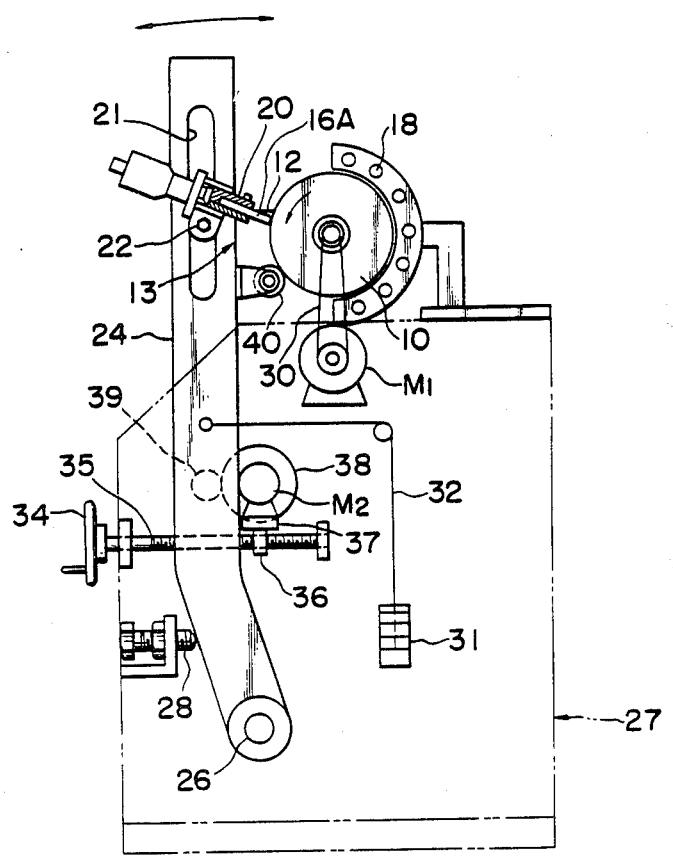
FIG. 4 is a side view illustrating an apparatus for applying the resin solution.

In the apparatus shown in FIGS. 1 and 2, the resin solution retainer 16 is a roller, but it may be in the form of a blade. FIG. 4 shows an apparatus for applying resin solution wherein a blade-type retainer is used.

In this figure, the blade-type retainer is shown at 16A. The retainer 16A is held adjustably by a support 20 which is in turn movable along a slot 21 to be fixed at any height along the slot. A fixing bolt 22 serves to tighten the support 20 at any position along the slot.

The slot 21 is formed in a substantially vertical lever 24 pivotally supported at 26 on a frame 27. A stop 28 functions to limit the swinging movement of the lever 24 away from the cylindrical base 10 which is driven by a motor $M_1$ via transmission means 30. A weight 31 exerts a force via a string 32 on the lever 24 to cause the same to swing toward the base 10, thereby to urge the tip edge of the blade retainer 16A to contact the surface of the base 10.

A handwheel 34 has a screwed shaft 35 rotatably supported in the frame 27. A nut 36 is in engagement with the shaft 35 and can be moved along the shaft by turning the wheel 34. The nut 36 supports thereon a mount 37 on which is supported a motor $M_2$. The output shaft of the motor $M_2$ is coupled to an eccentric cam 38 via a speed reduction mechanism not shown. A cam follower 39 is fixed to the lever 24 and is in contact with the cam 38. The lever 24 supports thereon a levelling roller 40 for levelling the resin solution layer applied to the surface of the base 10. As in the embodiment shown in FIGS. 1 and 2, the apparatus shown in FIG. 4 has a dryer 18 disposed at the side of the base 10 remote from the resin solution retainer 16A.

At the beginning of the resin solution applying step, the tip edge of the blade 16A is in sliding contact with the cylindrical surface of the base 10, so that the application of the resin solution starts with almost zero thickness of the applied layer. As the base 10 is rotated by the motor $M_1$ in the direction of the arrow, the motor $M_2$ is operated to rotate the eccentric cam 38 very slowly. Since the cam 38 is so contoured and disposed that its radius acting on the lever 24 increases gradually, the lever 24 is swung very slowly away from the base 10 so that the tip edge of the blade 16A also moves very slowly away from the base surface. As a consequence, the spiral application of the resin solution to the base surface is carried out.

It will be apparent that in the apparatus shown in FIG. 4 the blade 16A can be replaced by a rollertype retainer as shown in FIGS. 1 and 2.

EXAMPLE

A cylindrical base structure was used as a metal cylinder with a circumference of 660 mm and a length of 700 mm. This metal cylinder was previously heated to 40° C. After a roller-type resin solution retainer was brought in contact with the cylinder, a low viscosity resin liquid was supplied and applied as a coating onto the metal cylinder. This application of the resin liquid was made with the metal cylinder uniformly rotated at 3 rpm under heating and with the blade moved away from the cylinder at 5 to 30 $\mu$/min.

The resin liquid was methyl alcohol solution containing 30% of a photosetting polyamide resin (manufactured by Tokyo Oka Kōgyosha, Japan) of a viscosity set at 50 cps at 25° C. The application of the resin liquid for about fifteen minutes provided a coating film of excellent levelling having a film thickness of the order of 150$\mu$±20$\mu$. Subsequently, the coating film was subjected to photosetting with respect to the whole surface thereof by a light source of a high-pressure mercuryvapor lamp of 2.1 KW for about 20 minutes. The resin-coated cylinder thus obtained was mechanically engraved by means of an electronic engraver, Helio Klischograph K 200 type (trademark of the product manufactured by Dr.-Ing. Rudolf Hell GmbH, West Germany). In the engraving, 70 lines per centimeter were used, and the working standard was the same as that of the conventional copper-plated cylinder, but the burr cutter was not used.

Upon proofing of the engraved printing cylinder, an excellent tone reproduction was noted.

Thereafter, the cylinder was mounted in a gravure rotary press, and printing was carried out with the use of a toluene-ethyl acetate-IPA mixed solvent gravure ink and a steel doctor blade (Vickers' hardness number: 550), whereupon reproduction of improved full shadow density and excellent voluminous quality was obtained. Further no doctor scratches were noted with no problem involved after 400,000-meter web printing. After printing, the Ballard stripping of the resin layer was easily made, so that the cylindrical base structural could be reused.

What is claimed is:

1. Apparatus for applying a synthetic resin solution spirally to the surface of a cylindrical base, comprising:
    means for supporting and rotating the base;
    a resin solution retainer disposed along and closely adjacent to the base to define therebetween a sump for retaining the resin solution;
    means for moving the solution retainer slowly away from the base to cause the resin solution in the sump to flow onto the surface of the base for application of the solution to the base surface as a spirally laid layer, comprising a substantially vertical lever disposed adjacent to the base and pivotally supported at its lower end for movement toward and away from the base, said lever supporting adjustably thereon said solution retainer;
    means for moving said lever and thereby the solution retainer away from said base; and
    drying means disposed along said base to dry the solution applied to the base surface.

2. Apparatus according to claim 1, wherein said lever moving means is a motor-driven eccentric cam acting on the lever.

3. Apparatus according to claim 1 or 2, wherein said solution retainer is a roller.

4. Apparatus according to claim 1 or 2, wherein said solution retainer is a blade.

5. Apparatus according to claim 1, wherein said lever has a slot at its upper end part and said solution retainer is secured to a support which is adjustably slidable along the slot.

6. Apparatus according to claim 2, wherein the lever has a follower to be acted upon by the eccentric cam.

7. Apparatus according to claim 6, comprising means for acting on the lever in such a manner that the follower is urged against the cam.

8. Apparatus according to claim 2, comprising a substantially horizontal screw shaft having a handwheel, a nut engaging the screw shaft, and a mount secured to the nut and supporting thereon a motor for driving said eccentric cam.

* * * * *